United States Patent
Cai et al.

(10) Patent No.: US 7,867,866 B2
(45) Date of Patent: Jan. 11, 2011

(54) SOI FET WITH SOURCE-SIDE BODY DOPING

(75) Inventors: Jin Cai, Cortlandt Manor, NY (US); Tak Hung Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/651,499

(22) Filed: Jan. 4, 2010

(65) Prior Publication Data

US 2010/0105175 A1    Apr. 29, 2010

Related U.S. Application Data

(62) Division of application No. 11/757,472, filed on Jun. 4, 2007, now Pat. No. 7,655,983.

(51) Int. Cl.
*H01L 21/336* (2006.01)
*H01L 31/119* (2006.01)

(52) U.S. Cl. .......... 438/302; 257/344
(58) Field of Classification Search ........ 438/262, 438/302, 525, 531; 257/336, 344, E21.137, 257/E21.138
See application file for complete search history.

(56) References Cited

U.S. PATENT DOCUMENTS

| | | | | |
|---|---|---|---|---|
| 5,185,280 A | 2/1993 | Houston | | 438/163 |
| 5,448,513 A | 9/1995 | Hu | | 365/150 |
| 6,596,554 B2 | 7/2003 | Unnikrishnan | | 438/180 |
| 6,635,542 B2 | 10/2003 | Sleight | | 438/311 |
| 6,861,689 B2 * | 3/2005 | Burnett | | 257/296 |
| 7,655,983 B2 * | 2/2010 | Cai et al. | | 257/344 |

OTHER PUBLICATIONS

"Universal tunneling behavior in technology relevant P/N junction diodes", Journal of Applied Physics, vol. 95 (10), pp. 5800-5812, (2004), P. Solomon, et. al.

\* cited by examiner

*Primary Examiner*—Calvin Lee
(74) *Attorney, Agent, or Firm*—George Sai-Halasz; Vazken Alexanian

(57) ABSTRACT

An SOI FET device with improved floating body is proposed. Control of the body potential is accomplished by having a body doping concentration next to the source electrode higher than the body doping concentration next to the drain electrode. The high source-side dopant concentration leads to elevated forward leakage current between the source electrode and the body, which leakage current effectively locks the body potential to the source electrode potential. Furthermore, having the source-to-body junction capacitance larger than the drain-to-body junction capacitance has additional advantages in device operation. The device has no structure fabricated for the purpose of electrically connecting the body potential to other elements of the device.

7 Claims, 4 Drawing Sheets

SOI FET WITH SOURCE-SIDE BODY DOPING

CROSS REFERENCE TO A RELATED APPLICATION

This application is a Division of application Ser. No. 11/757,472, filed Jun. 4, 2007, which is incorporated herein by reference in its entirety.

FIELD OF THE INVENTION

The present invention relates to high performance electronic devices. In particular, it relates to SOI FET structures with shallow, electrically isolated device bodies, and ways to improve the electrical performance of such devices.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials, or alloys. Such a Si alloy may be, for instance, silicon-germanium (SiGe). The devices in the embodiments of the present disclosure are typically part of the art of single crystal, Si based material device technology. Or, more specifically, of the silicon-on-insulator (SOI) technology, where a layer of silicon based material for building devices sits on top of an insulating material.

There is a great difficulty in maintaining performance improvements in devices of deeply submicron generations. A useful scheme known in the art is to build devices in a semiconducting layer which is isolated from the semiconducting substrate by a buried insulating layer. Most commonly the semiconducting layer is Si, hence the terminology silicon-on-insulator (SOI) technology is in general use. The buried insulator usually is $SiO_2$, to yield the customary name of BOX (buried oxide).

Within SOI technology there exist a class of devices characterized as floating body devices. The term "floating" refers to the potential of the device body, as it is not tied to any particular controlled voltage source. The floating body in an SOI transistor leads to several undesirable effects. The circuit switching speed depends on the body potential, which may be a function of the previous switching history. The floating body is an additional source of variation that makes precise transistor-to-transistor matching more difficult than for bulk transistors. Therefore for many applications it would be desirable to have means to control the body potential. Such control, for instance, may be to tie the body potential to the source potential. This may usually be accomplished by changing the transistor layout to include a body contact region at the surface, which electrically connects to the body through the device width direction. There are several drawbacks of this solution. First, there is a layout area penalty, and secondly, the body contact resistance may be very large in wide-width devices. It also has been proposed (U.S. Pat. No. 6,635,542, by Sleight et al) to use a leakage, or damage, implant on the source side to introduce defects and to raise junction leakage between body and source to achieve an effective body-to-source tie. This approach is not fully satisfactory, and a solution to eliminate the problem, which in the art is often named the floating body, or memory problem, has still not been found.

SUMMARY OF THE INVENTION

In view of the discussed difficulties, embodiments of the present invention discloses a Field Effect Transistor (FET) device, which device includes a source electrode and a drain electrode, and also includes a device body located in-between the source electrode and the drain electrode. The body has a source interface with the source electrode and has a drain interface with the drain electrode. The body further contains a concentration of impurities of a first type. This concentration is higher next to the source interface than it is next to the drain interface. The body hosts a device channel, which channel is capable of carrying a device current between the source electrode and the drain electrode. Such a device current consists essentially of charge carriers of a second type. The FET device is free of any structure which would provide for electrical contact between the source electrode and the device body, and the FET device is characterized as being a silicon-on-insulator (SOI) FET, and the body is characterized as being a floating body.

A method for producing the FET device is also disclosed. The method includes: fabricating a source electrode and a drain electrode in a silicon-on-insulator (SOI) wafer. Fabricating a device body, which body is characterized as being a floating body, in-between the source electrode and the drain electrode, and providing for the body a source interface with the source electrode and providing a drain interface with the drain electrode. The method also involves introducing impurities of a first type into the body next to the source interface, while the device current capable of flowing between the source electrode and the drain electrode consists essentially of charge carriers of a second type.

BRIEF DESCRIPTION OF THE DRAWINGS

These and other features of the present invention will become apparent from the accompanying detailed description and drawings, wherein.

DETAILED DESCRIPTION OF THE INVENTION

It is understood that Field Effect Transistor-s (FET) are well known in the electronic arts. Standard components of a FET are the source, the drain, the body in-between the source and the drain, and the gate. The gate is overlaying the body, and it is capable to induce a conducting channel in the body between the source and the drain. In the usual nomenclature, the channel is hosted by the body. The gate is separated from the body by the gate insulator. There are two type of FET devices: a hole conduction type, called PFET, and an electron conduction type, called NFET.

In FET operation an inherent electrical attribute is the threshold voltage. When the voltage between the source and the gate exceeds the threshold voltage, the FETs are capable to carry current between the source and the drain. Since the threshold is a voltage difference between the source and the gate of the device, in general NFET threshold voltages are positive values, and PFET threshold voltages are negative values.

It is known in the art that there are FET devices characterized as being silicon-on-insulator (SOI) FETs. Such devices are formed in a layer of single crystal semiconductor material on top of an insulating layer. Typically, the semiconductor material is a Si based single crystal material, often essentially pure Si. The insulating layer is typically a so called buried oxide layer (BOX), which, in turn, is over a silicon wafer. Generally, in the art the structure of an insulating layer on top of a Si wafer, and a single crystal Si based layer on top of the insulating layer is referred to as an SOI wafer.

As the art progresses and devices are scaled to ever smaller dimensions and voltages, such as below 120 nm gate length, and below 1.8V power supply voltage, the semiconductor layer of the SOI wafer also becomes thinner. In a large class of SOI FET devices, the body of the devices has no effective electrical connection to other elements, consequently, these bodies have floating electrical potential. Such device bodies, are characterized as being a floating bodies. Usually, due to the thinness of the SOI semiconductor layer, other device parts, such as the source and drain, and possibly the device isolation structure, effectively penetrate down to the insulating layer, thereby electrically isolating the body, and leaving it at a floating potential.

Figure 1:
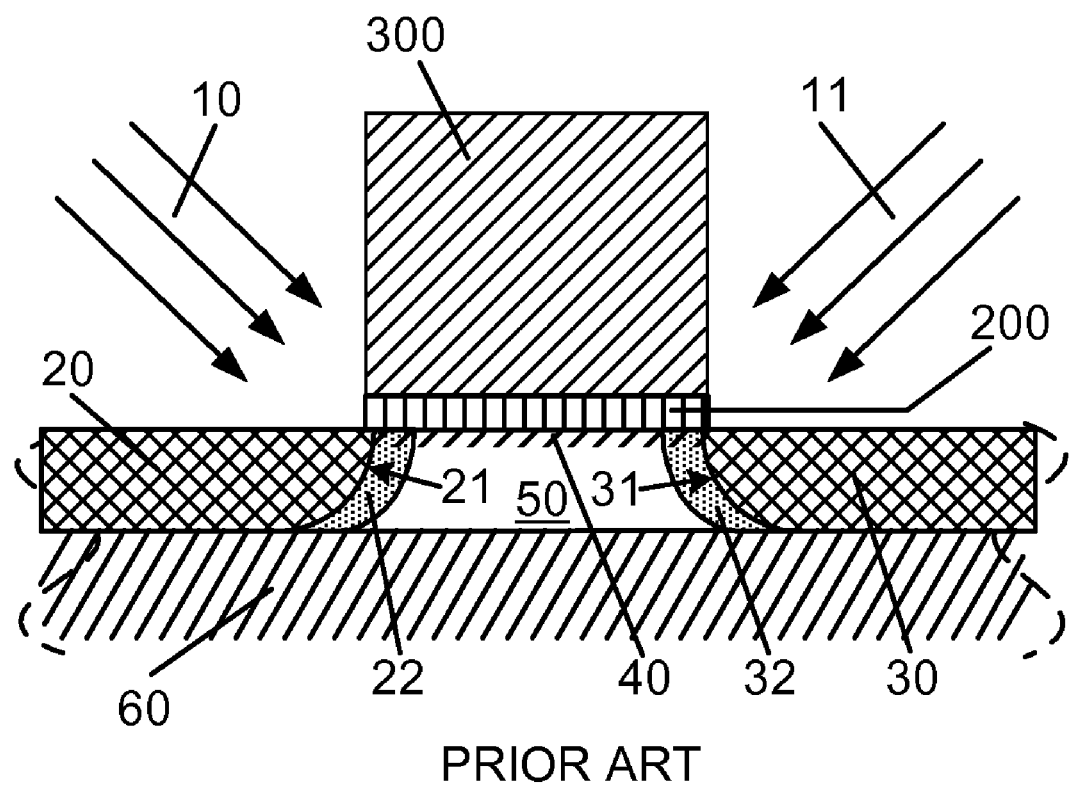
FIG. 1 shows a schematic cross section of a prior art FET with essentially symmetrical source-side and drain-side body doping.

FIG. 1 shows a schematic cross section of a prior art FET characterized as an SOI device with a floating body. The device in fabricated over an insulating layer 60. The source electrode 20 and the drain electrode 30 of the device are shown to penetrate all the way down to the insulating layer 60. The device body 50 is electrically isolated, or floating. The body has an interface with the source 21 and an interface with the drain 31. Between the source electrode 20 and the drain electrode 30 a device channel 40 is hosted by the device body 50. The channel is capable of carrying a device current between the source electrode 20 and the drain electrode 30. A gate 300 is overlaying the region of the channel 40 of the body 50, and typically a gate dielectric 200 separates the gate 300 and the channel 40 region of the body 50.

FIG. 1, also shows the typical prior art as far as body 50 doping is concerned. Next to each body interface, at the source interface 21 and at the drain interface 31, the body contains excess amount doping impurities in a symmetrical fashion, at the source-side 22 next to the source, and at the drain-side 32 next to the drain. In the art, these excess doping regions of the body 50 are characterized as being essentially symmetrical source-side and drain-side halo dopings. Reason for their use is known for someone skilled in the art, which mainly involves threshold control across gate length variability in a given technology.

The impurities in the desired concentration level, for the source-side 22 next to the source and for the drain-side 32 next to the drain, are typically introduced by angled, so called, halo implants. These implants are directed from the source direction 10 and from the drain direction 11. Angled implants are not the exclusive way known in the art for creating such dopant regions, others, such as dopant diffusion exist, as well.

Figure 2:
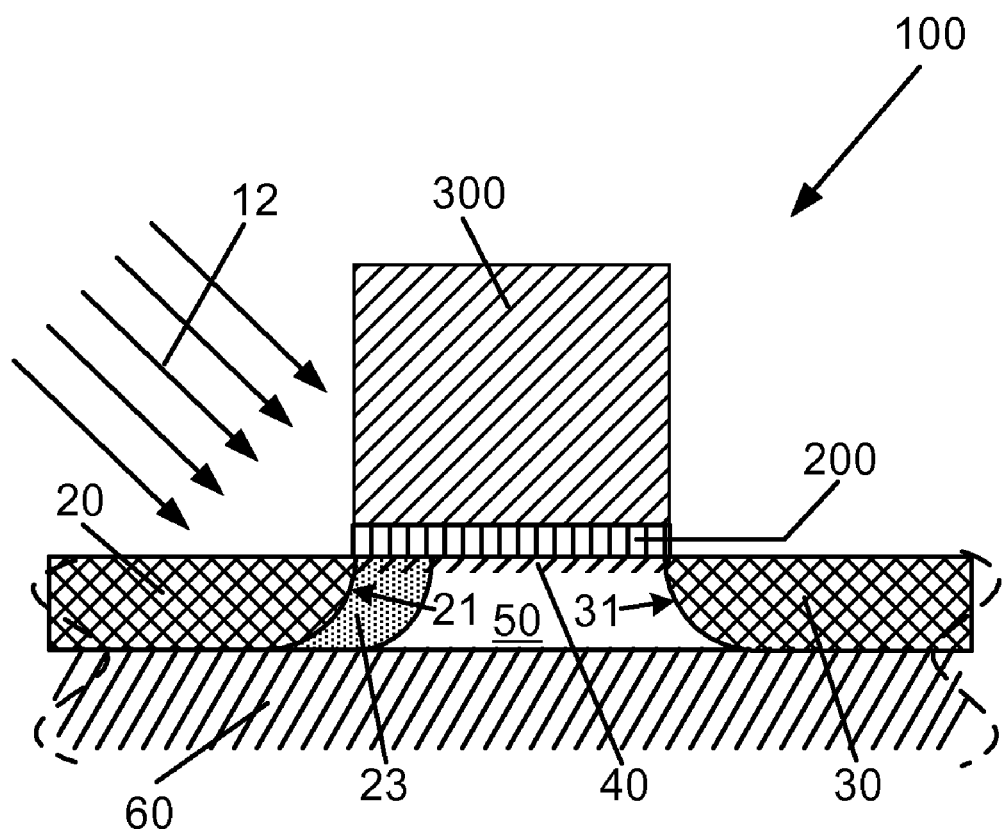
FIG. 2 shows a schematic cross section of an embodiment of the present invention, a FET with source-side body doping.

FIG. 2 shows a schematic cross section of an embodiment of the present invention: an FET 100 with source-side body doping. Representative embodiments of the present invention are characterized as being SOI FETs, with the body 50 characterized as being a floating body. As such, they share basic structure with prior art devices as are shown in FIG. 1. It is understood that in addition to the elements in the embodiments of the invention, figures may show further elements, since they are standard components of FET devices as known in the art. The device is fabricated over an insulating layer 60. A gate 300 is overlaying the region of the channel 40 of the body 50, and typically a gate dielectric 200 separates the gate 300 and the channel 40 region of the body 50.

The device body 50 is located in-between the source electrode 20 and the drain electrode 30. The device body 50 shares a source interface 21 with the source electrode 20, and shares a drain interface 31 with the drain electrode 30.

In the deeply submicron generations of FETs, the source/drain junctions and the body of a classical FET, namely $n^+$ regions forming junctions with a p-type device body for NFET, and $p^+$ regions forming junctions with an n-type device body for a PFET, are undergoing a myriad of changes, and may not resemble textbook cases. Variations may include all forms of source/drain junction metallization. The metallization may take on such degree that the metal completely replaces the semiconductor, and a Shottky barrier type contact exists between the source/drain and the channel, and possibly the body, as well. The source/drain may be alloyed with semiconductors of a different kind than the body. Further variations for sources and drains are know in the art, as well. Embodiments of the present invention are not limited by any particular realization of the NFET and PFET sources and drains, any and all variations are within the scope of the present invention. Hence, instead of using the terms of source and drain, in this disclosure the terms source electrode and drain electrode are being employed for the characterization of these FET elements. This nomenclature expresses the source/drain's role as electrical connection to the channel, without dwelling on particulars of the structure.

In FIG. 2 the source electrode 20 and drain electrode 30 are shown to interface with the insulating layer 60, thereby a fortiori isolating the body 50. In representative embodiments of the present invention, in general, this would be the case, but the figure should not be interpreted restrictively. There may be a layer of material similar to the body 50 left between the electrodes 20, 30 and the insulating layer 60. However, in embodiments of the present invention such a layer would have too high an electrical resistance for anchoring the body to a given potential, especially on the time scales relevant to typical circuit operations. Details of structure are significant only to the degree that the source and drain electrodes 20, 30, and any other isolation structure that may be employed, would leave the body 50 effectively in a floating electrical condition. The floating potential of the body would be exposed to variability on time scales longer than device switching, which may be in the $10^{-11}$ second range. During operations, the device switching can occur with the body being in differing voltage states. This, in turn, may lead to switching time variability. Such an undesirable variability is called the floating body, or floating body memory effect.

In the art of semiconductor devices and circuits two type of charge carriers are known, electrons, also referred to as n-type, and holes, also referred to as p-type. Often charge carriers arise due to the presence of impurities in the basic semiconductor material, for instance Si. Such impurities are called doping impurities. There may be first type of impurities that are capable to give rise to charge carriers of the first type, and second type of impurities that are capable to give rise to charge carriers of the second type.

In representative embodiments of the present invention a device channel 40 is hosted by the device body 50. The channel is capable to carry a device current between the source electrode 20 and the drain electrode 30.

Assuming that the device current consists essentially of charge carriers of a second type, then the body 50 typically contains doping impurities of the first type. The essentially uniform existing concentration of such impurities of the first type in the body 50, depending on particular device design, may span a wide range of values, up to into the low $10^{19}/cm^3$ range. As FIG. 2 indicates, in the exemplary embodiments of the present invention there is no excess impurity concentration in the body 50 next to the drain interface 31. However there is excess concentration of impurities of the first type in the body 50 at source-side 23 next to the source interface 21. In this manner, in the body the concentration of impurities of the first type next to the source interface 21 is higher, than their concentration next to the drain interface 31.

In a typical embodiment of the present invention the concentration of impurities of the first type next to the source interface 21 may be more than two times higher than the concentration next to the drain interface 31. However, depending on particular device design, this concentration of impurities of the first type next to the source interface 21 may be more than 10 times higher than the concentration next to the drain interface 31. In usual embodiments of the present invention the concentration of impurities of the first type next to the source interface 21 may be higher than about $3 \times 10^{18}/cm^3$.

Representative embodiments of the invention include both type of devices. If the FET device 100 is an NFET device, then the impurities of the first type are p-doping impurities, the charge carriers of the first type are holes, and the charge carriers of the second type are electrons. The p-doping impurities of use may include species known in the art, such as B, Ga, In, and possibly their mixtures. Conversely, if the FET device 100 is a PFET device, then the impurities of the first type are n-doping impurities, the charge carriers of the first type are electrons, and the charge carriers of the second type are holes. The n-doping impurities of use may include species known in the art, such as P, As, Sb, and possibly their mixtures.

As FIG. 2 schematically indicates, and without limitations, the FET device 100 in the embodiments of the present invention is free of any structure which would provide an electrical contact between the source electrode 20 and the device body 50. A structure formed for such purposes would lead to an area penalty and certainly also to a complexity penalty. Area penalty means increased area for the device, and complexity penalty entails additional, or extended processing steps. The FET device 100 does not need a structure for the purpose of specifically providing an electrical contact between the source electrode 20 and the device body 50. In devices of the embodiments of the present invention, the potential of the body 50 is well controlled by a current due to the increased source-side 23 impurity doping. The increased source-side impurity doping, besides clamping of the body potential to the source potential, it has further advantages as it will be detailed.

It is understood that FIG. 2 is only a schematic representation. As known in the art, there may be many more, or less, elements in the device structures than presented in the figure, but these would not affect the scope of the embodiments of the present invention.

The behavior of junctions with highly conductive regions on both sides of the junction has recently been extensively reexamined. In a study: "Universal tunneling behavior in technology relevant P/N junction diodes", Journal of Applied Physics, Vol. 95 (10), pp. 5800-5812, 2004, by P. Solomon, et. al., incorporated herein by reference, it is shown that the junction current, in both forward and reverse directions, increases by many orders of magnitude, $\sim 10^4$-$10^5$, with a dopant increase from about $10^{18}/cm^3$ to about $10^{19}/cm^3$, for bias voltages below about 0.5V. Embodiments of the present invention take advantage of this increased junction current at low bias voltages, by using the source-side impurity concentration in the about over $10^{18}/cm^3$ range. It is possible that the threshold control for an ensemble of transistors might be a little less effective with only a source-side halo, but this is a small price to pay when compared to the advantages. Having low doping, and thus, low capacitance at the body/drain electrode interface 31, by itself has additional benefits.

Figure 3A:
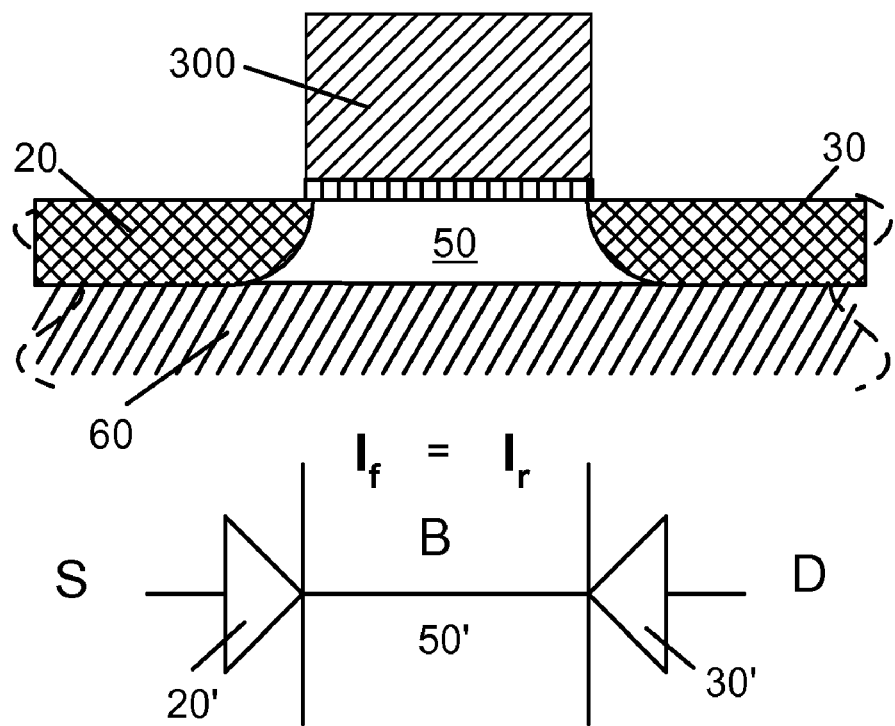
FIGS. 3A and 3B schematically illustrate electrical behavior of FET devices according to embodiments of the present invention.
Figure 3B:
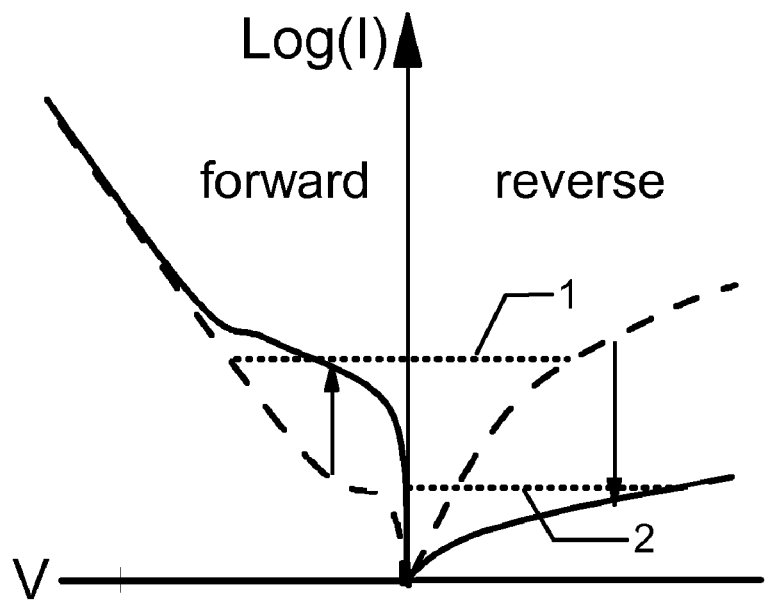

FIGS. 3A and 3B schematically show electrical behavior of FET devices according to embodiments of the present invention. FIG. 3A shows, on the top part, a floating gate SOI FET in order to make connection with the bottom part of the figure, which displays circuit components. The source 20, body 50, and drain 30, structure electrically is equivalent to two back-to-back diodes, with the body 50 being a common element in both diodes. In the bottom part of the figure the structural elements are replicated, with "priming" the identical indicator numbers for the equivalent elements of the circuit and the structure. The source 20 and drain 30 become the half of the diodes 20' and 30', with the body 50 the other half 50' for each of the diodes. The connection is further accentuated by the capital letters "S", "B", and "D", standing for source, body, and drain. The voltage state of the body 50 can be obtained from the condition that the current flowing into the body from the source electrode has to leave the body trough the drain electrode. Hence, the lower, the circuit picture, depicts back to back diodes with the condition that the forward current has to equal to the reverse current: $I_f = I_r$.

FIG. 3B illustrates the voltage relations between the three, source/body/drain, elements for both a symmetrical halo doping as known in the art, and the source-side doping case of the embodiments of the present invention. The figure gives forward and reverse currents for diodes, such as depicted in FIG. 3A, with the a linear voltage axis (V), and a logarithmic current axis (Log(I)). The dashed lines show the prior art symmetrical doping situation, while the solid lines give the situation in the embodiments of the present invention, namely with strong source-side doping.

In normal operation of the FET device the bias voltages are such that the source-body junction is forward biased and the drain-body junction is reverse biased. Only the total voltage over the two diodes is fixed, as the applied source/drain voltage. The individual voltage on the two diodes comes from the $I_f = I_r$ condition. The total applied voltage, and the distribution over the two diodes, are indicated by the dotted lines.

For the symmetrical doping case of the known art, the dotted line, indicated as 1, illustrates the resulting voltages. Since for the total applied voltage, which may be in the range of about 1V, the forward and reverse currents are of similar magnitude, the body takes on a potential of about half the applied drain potential. The body is charged up, and will display detrimental memory effects, as function of switching activity, as one versed in the art would know.

In contrast, for the embodiments of the present invention, shown by the solid lines and the dotted line labeled as 2, the lack of doping decreases the drain side reverse current, wile the strong source-side doping increases the source side forward current. The impurity concentration at source-side 23 next to the source interface 21 is suited to induce an excess forward type current between the source electrode 20 and the body 50. For a given drain voltage, as dotted line 2 shows, essentially the whole of the applied voltage falls on the reverse biased drain diode, since, again, the $I_f=I_r$ condition applies. The potentially huge forward current means that the body potential is locked to the source potential, consequently it does not "float". A body locked to a fixed potential, such as the source electrode potential, will not have the undesirable memory effects. If one designates the source electrode as having a first potential and the body as having a second potential, then in the embodiments of the present invention the excess forward type current, due to the strong source-side doping, keeps the first and second potentials to less than about 0.2V apart. Consequently, the FET device 100 of the embodiments of the present invention may be free of any specific fabricated structure which would have as its purpose the electrical contact between the source electrode 20 and the body 50.

A source, as discussed earlier, may take on a variety of structural forms. In embodiments of the present invention often the source electrode 20 may contain impurities of the second type, which second type of impurities are capable to give rise to charge carriers of the second type, the type found in the device current. Furthermore the source electrode may have a portion which is metallized, for example by silicidation.

A further benefit of the increased source-side impurity doping is in the capacitance values of the junctions. The source electrode 20 to body 50 junction capacitance $C_{jsb}$, is increased and the drain electrode 30 to body 50 junction capacitance $C_{jdb}$ is decreased compared to a prior art symmetrical halo doped case. A smaller $C_{jdb}$ enables faster and more uniform device switching, as one versed in the art would know. Accordingly, the low impurity concentration in the body next to the drain interface 31 allows for increased switching speed for the FET device 100. Another advantage of having a larger $C_{jsb}$ is that it helps to lock the body potential even after device switching. As a result, the memory effect in SOI circuit operation may be further minimized. As an example, when an advanced NFET device switches from 'on-state' to 'off-state' in an inverter circuit, its gate voltage drops from about 1V to 0V, and its drain voltage increases from 0V to about 1V. The body potential is influenced by changes in gate and drain voltages through capacitive coupling. When $C_{jsb}$ is higher than $C_{jdb}$, the body potential would be 'locked' to the source voltage rather than following the drain voltage. This affords a further stability in the body potential, and less memory effect.

In discussing methods for fabricating the SOI FET structure 100, only processing steps relevant to for embodiments of the present invention will be detailed. Manufacturing of FET devices, and their circuit structures, such as CMOS, is very well established in the art. It is understood that there are a large number of steps involved in such processing, and each step might have practically endless variations known to those skilled in the art. It is further understood that the whole range of known processing techniques are available in the fabricating of the disclosed device structure.

The processing of the FET device 100 includes fabricating a source electrode 20 and a drain electrode 30 in an SOI wafer. One also fabricates a device body 50, characterized as being a floating body, in-between the source electrode and the drain electrode.

In typical embodiments of the present invention one introduces impurities of a first type into the body 50 at source-side 23 next to the source interface 21. The introduction of first type impurities usually involves an angled implantation 12 on the source-side. The dose and energy of the source-side angled implant may vary broadly. The dose maybe in the range of about 1.5 to 4 times the dose the source-side would receive in the prior art symmetrical source/drain halo implant. The energy and the dose of the source-side implant in embodiments of the present invention might be, for instance for B, from about 3 keV to about 10 keV energy, at a dose in the range of about $10^{13}/cm^2$ to $10^{14}/cm^2$. Also, since the aim of the source-side impurity halo may be to increase the forward current of the source/body junction, one may include into the angled implantation 12 some additional elements. These additional elements would be intended to create defects, or damage, and thereby increase junction leakage. Such "damage" implant elements may be, for instance, Xe or Ge.

Besides angled implantation, there are other processes known in the art, such as diffusion, for introducing impurities. Any and all additional methods for introducing impurities may be employed for fabricating the embodiments of the present invention.

One typically would not implant into the body from the drain-side. However, there may be circumstances where such a drain-side angled implant, or other impurity introducing step, may be necessary. For instance, one might want to have a trade-off in floating body control and threshold control across ensembles of transistors. A high-dose source-side implant combined with a low-dose drain side implant can provide such a trade-off. In such a case the impurity concentration introduced by the drain-side operations, such as an angled implant, would be lower than that resulting from the source-side operation.

Having done with the introduction of the source-side halo impurities, one would complete the processing of the FET device 100 with steps known in the art. All the while one would avoid the fabrication of any structure that would provide electrical contact between the source electrode and the device body. Such a structure is not needed since the source-side excess impurity concentration accomplishes the same purpose, namely locks the potential of the body 50 to that of the source 20.

Figure 4:
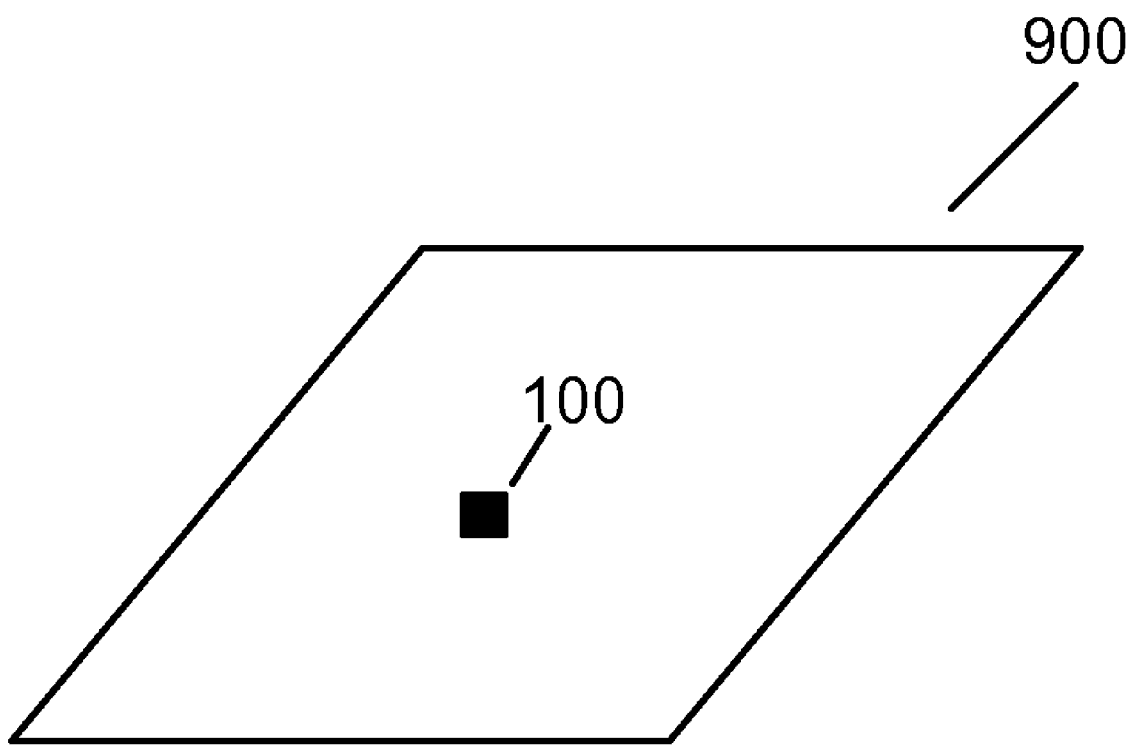
FIG. 4 shows a symbolic view of a processor containing at least one FET device according to an embodiment of the present invention.

FIG. 4 shows a symbolic view of a processor containing at least one SOI FET device according to an embodiment of the present invention. Such a processor 900 has at least one chip which contains at least one SOI FET device 100, with the body having a concentration of impurities next to the source electrode interface higher than the concentration of such impurities next to the drain electrode interface. The processor 900 may be any processor which can benefit from embodiments of the present invention, which yields high performance circuits. Representative embodiments of processors manufactured with embodiments of the disclosed structure are digital processors, typically found in the central processing complex of computers; mixed digital/analog processors, typically found in communication equipment; and others.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

We claim:

1. A method for processing a Field Effect Transistor (FET) device, comprising:
   fabricating a source electrode and a drain electrode in a silicon_on_insulator (SOI) wafer;
   fabricating a device body, characterized as being a floating body, in-between said source electrode and said drain electrode, and providing for said body a source interface with said source electrode and providing a drain interface with said drain electrode; and
   introducing impurities of a first type into said body next to said source interface, wherein said first type of impurities are capable to give rise to charge carriers of a first type, wherein a device current capable of flowing between said source electrode and said drain electrode consists essentially of charge carriers of a second type.

2. The method of claim 1, further comprising:
   selecting said introducing of impurities in such manner that a concentration of said impurities of said first type in said body next to said source interface is more than twice said concentration of said impurities of said first type in said body next to said drain interface.

3. The method of claim 1, further comprising:
   selecting a concentration for said impurities of said first type in said body next to said source interface to be higher than about $3 \times 10^{18}/cm^3$.

4. The method of claim 1, wherein said introducing of impurities is accomplished by an angled implantation.

5. The method of claim 1, further comprising:
   selecting said FET device to be a PFET device, selecting said impurities of said first type to be n-doping impurities, wherein said charge carriers of said first type are electrons, and selecting said charge carriers of said second type to be holes.

6. The method of claim 1, further comprising:
   selecting said FET device to be an NFET device, selecting said impurities of said first type to be p-doping impurities, wherein said charge carriers of said first type are holes, and selecting said charge carriers of said second type to be electrons.

7. The method of claim 1, wherein said fabricating of said source electrode comprises introducing impurities of a second type, wherein said second type of impurities are capable to give rise to charge carriers of said second type.

* * * * *